(12) United States Patent
Grittke et al.

(10) Patent No.: US 8,271,773 B2
(45) Date of Patent: Sep. 18, 2012

(54) CONFIGURABLE FIELD DEVICE FOR USE IN PROCESS AUTOMATION SYSTEMS

(75) Inventors: Udo Grittke, Steinen (DE); Armin Wernet, Rheinfelden (DE); Roland Dieterle, Lörrach (DE); Axel Humpert, Rheinau (DE); Dietmar Frühauf, Lörrach (DE); Romuald Girardey, Huningue (FR); Jürgen Becker, Jockgrim (DE); Michael Huebner, Karlsruhe (DE); Katarina Paulsson, Liclingo (SE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 139 days.

(21) Appl. No.: 12/311,855

(22) PCT Filed: Sep. 10, 2007

(86) PCT No.: PCT/EP2007/059440
§ 371 (c)(1),
(2), (4) Date: Oct. 14, 2010

(87) PCT Pub. No.: WO2008/046694
PCT Pub. Date: Apr. 24, 2008

(65) Prior Publication Data
US 2011/0035576 A1   Feb. 10, 2011

(30) Foreign Application Priority Data

Oct. 17, 2006 (DE) .......................... 10 2006 049 501
Oct. 17, 2006 (DE) .......................... 10 2006 049 502
Oct. 17, 2006 (DE) .......................... 10 2006 049 509

(51) Int. Cl.
G06F 9/00 (2006.01)
G06F 19/00 (2006.01)
G06F 17/50 (2006.01)
G08B 29/00 (2006.01)
H03M 1/00 (2006.01)
G01D 1/00 (2006.01)

(52) U.S. Cl. ......... 713/100; 713/1; 340/870.2; 341/126; 702/1; 702/127; 716/100

(58) Field of Classification Search ............. 713/1, 100; 340/870.21; 341/126; 702/1, 127; 716/100
See application file for complete search history.

(56) References Cited

U.S. PATENT DOCUMENTS

| | | | | |
|---|---|---|---|---|
| 6,314,551 | B1 * | 11/2001 | Borland | 716/117 |
| 6,871,341 | B1 * | 3/2005 | Shyr | 717/131 |
| 6,982,570 | B1 * | 1/2006 | Ang et al. | 326/41 |
| 7,269,738 | B1 * | 9/2007 | Kivimaki | 713/189 |

FOREIGN PATENT DOCUMENTS

| | | |
|---|---|---|
| DE | 101 61 401 A1 | 6/2003 |
| EP | 1 108 984 A1 | 6/2001 |
| WO | WO 03/098154 A1 | 11/2003 |

* cited by examiner

*Primary Examiner* — Stefan Stoynov
(74) *Attorney, Agent, or Firm* — Bacon & Thomas, PLLC

(57) ABSTRACT

A configurable field device for automation technology with a partially dynamically reconfigurable logic chip FPGA, in which function modules are dynamically configured during runtime, and to a method for operating the configurable field device.

16 Claims, 9 Drawing Sheets

CONFIGURABLE FIELD DEVICE FOR USE IN PROCESS AUTOMATION SYSTEMS

TECHNICAL FIELD

The invention relates to a configurable field device for process automation technology.

BACKGROUND DISCUSSION

In automation technology, especially in process automation technology, field devices are often applied, which serve for registering and/or influencing process variables. Examples for such field devices are fill level, measuring devices, mass flow measuring devices, analytical measuring devices, pressure and temperature measuring devices, etc., which, as sensors, register the corresponding process variables, fill level, flow, pressure, pressure difference, pH-value, or temperature.

Serving for influencing process variables are actuators, e.g. valves or pumps, via which the flow of a liquid in a pipeline section, or the fill level in a container, can be altered.

A large number of such field devices are available from the members of the firm, Endress+Hauser.

As a rule, field devices in plants equipped with modern automation technology are connected via communication networks (HART-Multidrop, Profibus, Foundation Fieldbus, etc.) with superordinated units (e.g. control systems, control units). These superordinated units serve for process control, process visualizing, process monitoring as well as for startup, or for servicing the field devices.

Necessary supplemental components for operation of fieldbus systems are components which are directly connected to a fieldbus and which serve, especially, for communication with the superordinated units. Examples of such components include remote I/Os, gateways, linking devices, and controllers. These are frequently also referred to as field devices.

In part, fieldbus systems are also integrated in enterprise networks, which work on an Ethernet basis. In this way, process or field device information can be accessed from different regions of an enterprise.

For worldwide communication, company networks can also be connected with public networks, e.g. the Internet.

Needed for servicing and startup of field devices are corresponding operating programs, e.g. FieldCare, Endress+Hauser; Pactware; AMS, Emerson; Simatic PDM, Siemens).

Serving for plant control and monitoring of larger plants are control system applications, e.g. Simatic S7, Siemens; Freelance, ABB; and Delta V, Emerson).

An essential aspect of open communication systems, such as e.g. Profibus, Foundation Fieldbus or HART, is the interoperability and replaceability of devices of different manufacturers. Thus, sensors or actuators of various manufacturers can be used together without problem. Also, an option is to replace a sensor of a certain manufacturer with a functionally equal sensor of another manufacturer.

Today's field devices are becoming increasingly complex. Besides pure measured value processing, diagnostic tasks and, above all, communication tasks, which field devices must fulfill as regards the installed bus systems, are becoming always more complex. In order to perform these tasks correctly, most often, a plurality of microcontrollers are provided in modern field devices. The advantage in the application of microcontrollers is that, via application-specific, software programs, which run in these microcontrollers, the most varied of functionalities are implementable and program changes can be put into practice relatively simply. Program controlled field devices are therefore very flexible. This high flexibility is, however, gained with the disadvantage that, because of sequential progression through the programs, processing speed is relatively slow.

In part, therefore, in field devices, also so called ASICs (Application Specific Integrated Circuits) are applied. Through their application-specific construction, these chips can process data/signals very rapidly. Especially, they are very suitable for computationally intensive applications.

The functionality of these chips is, however, fixedly predetermined. The use of ASICs is economically feasible only in the case of large piece numbers, since the developmental effort and the therewith connected costs are relatively high. A subsequent changing of functionality is not possible in the case of these chips.

From WO03/098154, a configurable field device is known, wherein a reconfigurable logic chip is provided. Here, during system start, the logic chip, which has at least one microcontroller, which is also referred to as an embedded controller, is configured. After configuration is finished, the required software is loaded into the microcontroller.

The, in such case, required, reconfigurable logic chip must have available sufficient resources, in order to be able to fulfill all desired functionalities. Such "large" logic chips, with much memory capacity, require, however, correspondingly much energy.

The use of smaller logic chips with smaller energy consumption would mean a considerable limitation in the functionality of the field device.

SUMMARY OF THE INVENTION

An object of the invention is, therefore, to provide a configurable field device for process automation technology and a method for operating such a field device, not having the above discussed disadvantages, while, especially, consuming little energy and, simultaneously, providing a high measure of functionality.

An essential idea of the invention is to provide in a field device a dynamically reconfigurable logic chip, in which individual function modules are configured on request of a control program running in a microcontroller or a hardware based control unit having a corresponding flow control. When certain function modules are currently not required, their resources are available for use by other function modules. The partial reconfiguration of FPGAs has the goal of being able to replace individual modules within the structure. In the case of a dynamic partial reconfiguration, the replacement happens during operation of the field device.

In a further development of the invention, configuration of the function modules occurs by means of a configuration bit stream, which is loaded into the reconfigurable logic chip.

In a further development of the invention, the entire processing unit is embodied as a dynamically reconfigurable logic chip and divided into a dynamic region and a static region, wherein, in the static region, the control unit is permanently configured.

In a further development of the invention, at least one function module serves for evaluating the measurement signal.

In a further development of the invention, the function module for evaluating the measurement signal is a signal filter.

In a further development of the invention, at least one function module serves for generating the output value for the communication circuit.

In a further development of the invention, the function module for generating the output value for the communication circuit is a fieldbus controller, or a HART modem.

In a further development of the invention, a function module serves for operating a display/service unit.

In a further development of the invention, the function module is a digital filter, which is composed of a base block and a plurality of expansion blocks.

In a further development of the invention, a logic chip is provided, which has a plurality of logic cells, which are connected together via electronic switches, wherein, in a static region of the logic chip, function modules are fixedly configured, wherein the logic cells of these function modules are connected together via permanent connections, and, in a dynamic region, function modules are configured as a function of time, wherein the logic cells of these function modules are connected together via electronic switches as a function of time.

In a further development of the method of the invention, during the system start phase, the following method steps are performed: Configuring at least one function module with high priority at a point in time t1, executing this function module, configuring at least one function module with medium priority at a point in time t2, executing this function module, configuring at least one function module with low priority at a point in time t3, and executing this function module.

In a further development of the method of the invention, the number of logic circuits of at least one function module is different during the system start phase and during the operational phase.

In a further development of the method of the invention, function modules with high priority have more logic circuits available during the system start phase.

In a further development of the method of the invention, at the beginning of the system start phase, a microprocessor is configured with initialized registers.

In a further development of the method of the invention, a test module is configured, which serves for testing function modules and/or software functionalities of the field device.

In a further development of the method of the invention, the test module is configured only during the production phase of the field device.

In a further development of the method of the invention, the test module is cyclically or sporadically configured on request of the control program.

In a further development of the method of the invention, the area, which a function module uses on the reconfigurable logic chip, is expanded or lessened.

BRIEF DESCRIPTION OF THE DRAWINGS

The invention will now be explained in greater detail on the basis of an example of an embodiment presented in the drawing, the figures of which show as follows.

DETAILED DISCUSSION IN CONJUNCTION WITH THE DRAWINGS

Figure 1:
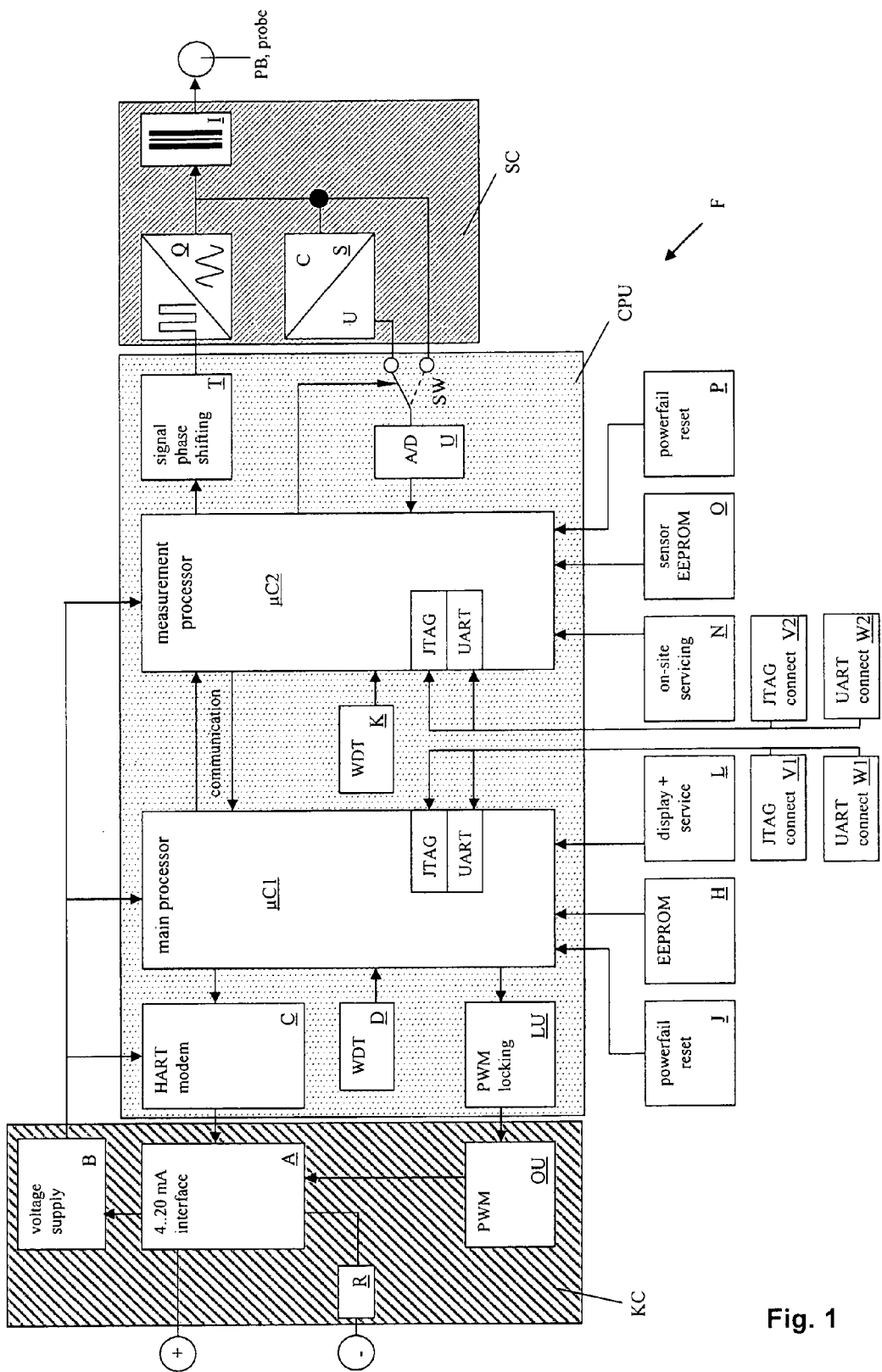
FIG. 1 is a block diagram of a conventional field device.

FIG. 1 shows a block diagram of a conventional field device in greater detail. This is a capacitive, fill-level, measuring device.

Field device F includes, essentially, an analog sensor circuit SC, a central processing unit CPU having two microcontrollers µC1 and µC2, as well as an analog communication circuit KC. The analog sensor circuit SC serves for producing an analog measurement signal dependent on fill level. In the sensor circuit SC, with the assistance of a low pass filter Q, there is produced from a rectangular signal a sine wave (reference signal), which is fed via an isolating unit I to a capacitive probe PB, which serves for registering the process variable "fill level". The isolating unit I enables signal isolation via capacitive or inductive coupling and is designed to meet safety requirements (Ex requirements).

The exciting voltage signal (reference signal), which is independent of fill level, is digitized in a converter unit U and evaluated in the microcontroller µC2. Alternatingly, a fill level dependent, electrical current signal (measurement signal) is evaluated in the microcontroller µC2. For this, an electrical current to voltage converter S is necessary, which converts the electrical current signal into a voltage signal, which is then digitized in the converter unit U. The two signals are evaluated and processed alternately in the microprocessor µC2. The switching between the two signals occurs via the switch SW.

The digital output signal for generating the sinusoidal signal is produced in the microcontroller µC2 and forwarded via a phase shifting unit T to the filter Q. With the phase shifting unit T, the phase of the reference signal can be appropriately shifted, in order to adapt the measurement signal optimally to the requirements of the converter unit U.

Faultless program execution of the microcontroller µC2 is monitored by a watchdog timer K. In case a program error occurs, a program reset is triggered via the watchdog timer K.

Further connected with the microcontroller µC2 are an onsite servicing capability N, a data memory O and a power fail reset circuit P. The onsite servicing capability N permits simple adjusting of device parameters, in the data memory O are stored sensor data and the power fail reset circuit P triggers a program reset in the case of voltage interruption.

Besides the microprocessor µ02, which essentially serves for evaluating the measurement signal, a further microcontroller µ01 is provided, which serves for generating output values for the process variable and for actual control of the field device F. Likewise connected with the microcontroller µC1 are a watchdog timer D and a power reset circuit J. Additionally connected with the microcontroller µC1 are a data memory H, a display/service unit L, a modem C and a locking unit LU.

Connected to the modem C is the communication circuit KC, which serves for connection to a process control loop (2-wire control loop).

In the present case, the field device F is designed for HART communication. The modem C is, therefore, a HART modem. Also the communication circuit KC is suited for HART communication and includes a 4-20 mA interface A and a HART communication resistor R.

Via a 4-20 mA electrical current signal, the measured value can be transmitted, as output value of the field device, via the process control loop, to an external unit. The external unit is, for example, a programmable logic controller, which processes the output value and actuates actuators correspondingly.

The field device F is also supplied with energy via the 4-20 mA interface A. Serving, in this connection, is a voltage supply circuit B, to which the individual, energy consuming components of the field device F are connected.

The actuating value for the 4-20 mA electrical current signal is issued by the microcontroller μC1 as a pulse width modulated signal (PWM signal). A locking unit LU sets, in case a reset is present, the duty cycle of the PWM signal to 0%. Via an operating unit OU, the 4-20 mA interface A so operated, that the desired electrical current signal is transmitted over the process control loop.

For test purposes, the two microprocessors μC1 and μC2 have, in each case, a standardized JTAG interface with corresponding connectors V1 and V2, respectively.

For communication, both microprocessors μC1, μC2 have also standard serial UART interfaces with corresponding connectors W1 and W2, respectively.

Running in the microprocessors μC1 and μC2 are the appropriate application programs (firmware). These application programs are composed of a number of program components, such as measured value processing, diagnosis, operating, or servicing, menu, etc.

The dotted part represents the region of the field device F, in which data in digital form are processed. The remaining region (hatched part) is the analog region having a number of analog circuit components as external components.

Frequently, parts of the modem C and the communication circuit KC are implemented in an ASIC.

The functioning of this conventional field device will now be explained in greater detail.

The field device F serves for determining the fill level of a liquid in a container. Fill level is the deciding process variable, or controlled output, for the process control.

Changing with fill level is the capacitance of the probe PB. The capacitance is ascertained with the assistance of the sensor circuit SC, which outputs two analog signals (reference signal and measurement signal), which are converted in the converter unit U into digital signals. The digital signals are evaluated in the processing unit CPU and, indeed, in the microcontroller μC2, in which a special evaluation program is running for the measurement signal and reference signal. Following the evaluation, e.g. the current fill level, or the fill quantity, in the container of concern is then available as output value. This measured value can be forwarded via the analog communication circuit KC and the process control loop to an external unit.

The processing unit CPU serves essentially for evaluating the measurement signal, for generating the output signal for the process variable and for control of the field device F. For performing these tasks, corresponding programs are executed in the two microcontrollers μC1 and μC2.

Figure 2:
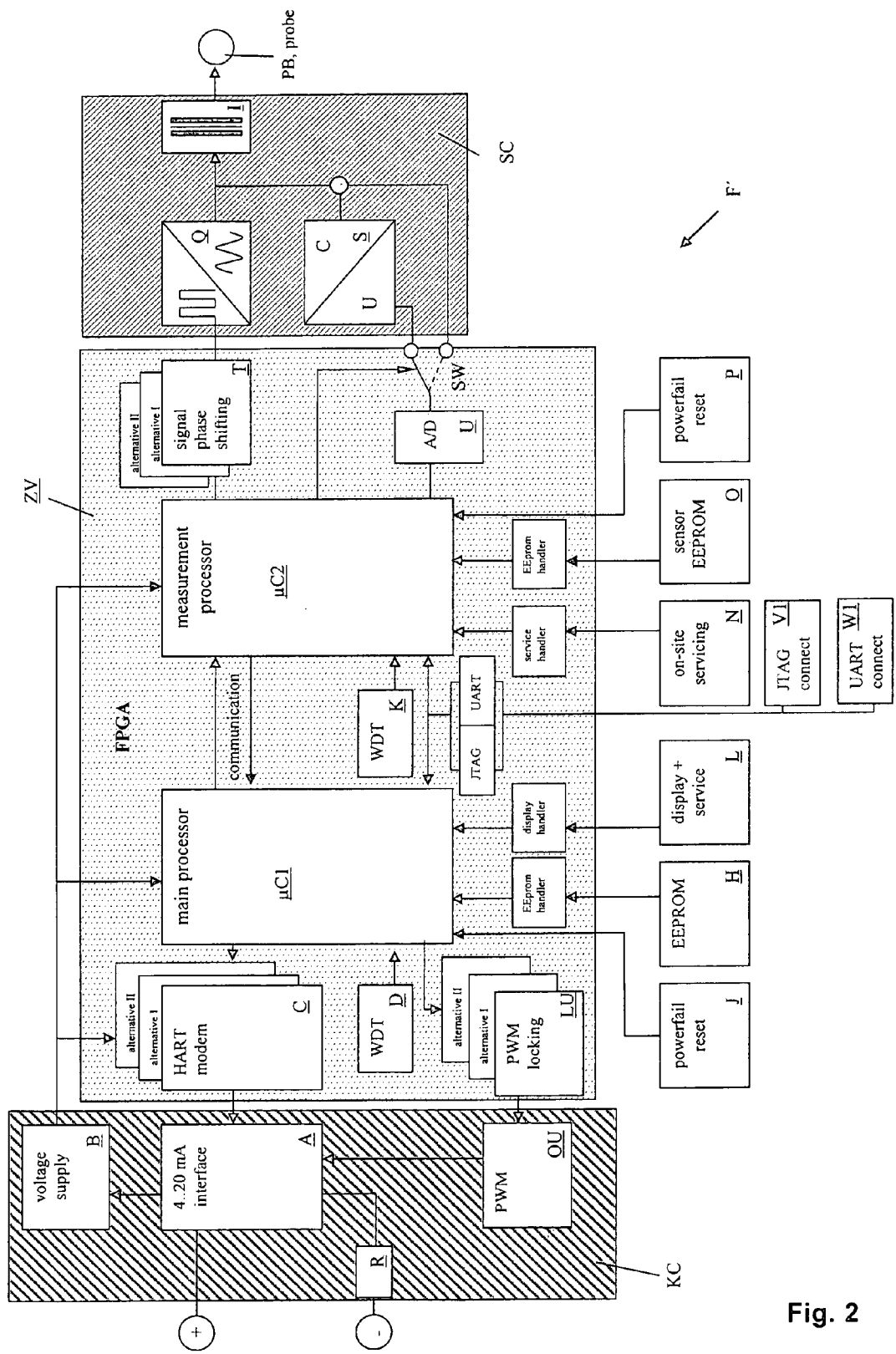
FIG. 2 is a schematic drawing of a field device having a reconfigurable logic chip.

FIG. 2 is a block diagram of a configurable field device F' containing a reconfigurable logic chip FPGA (field programmable gate array). Field device F' functions in the manner of the field device of FIG. 1. In principle, all components of the central processing unit CPU of FIG. 1 are configured on the reconfigurable logic chip FPGA. For individual components already present in the field device of FIG. 1, supplementally, alternatives are shown—thus, for example, for the HART modem C (where, as alternatives, Profibus or Foundation Fieldbus controllers are conceivable), for the locking unit LU and for the phase shifting unit T. For operating the components, data memory EEPROM, display/service unit L, onsite servicing capability N and sensor data memory O, supplementally, corresponding operators, which are also referred to as "handlers", are provided.

This field device F' can be configured for various alternative applications. An essential disadvantage of this field device lies, however, in the high resource requirements and the therewith associated, high energy requirement.

Figure 3:
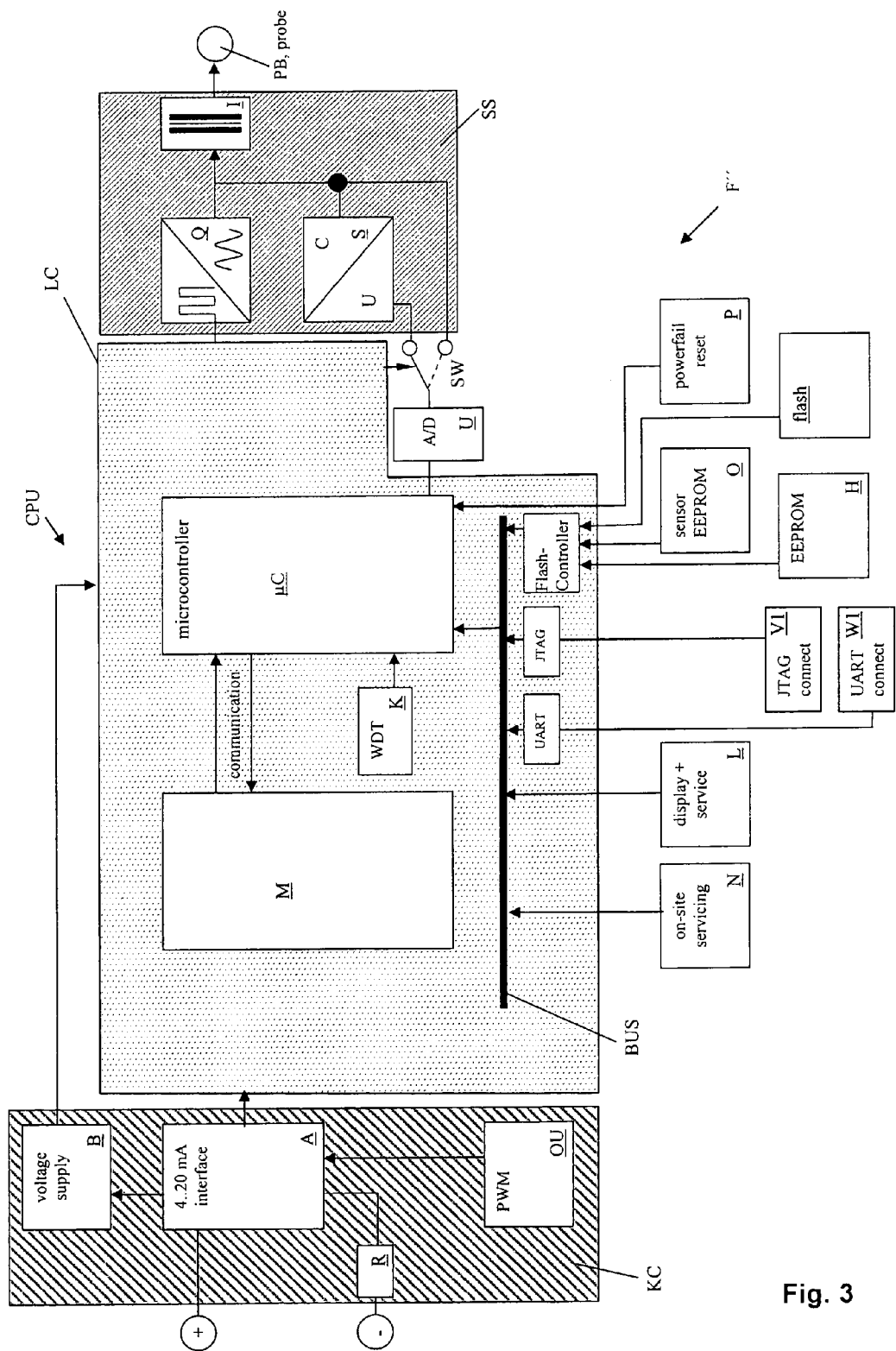
FIG. 3 is a field device having a dynamically reconfigurable logic chip

FIG. 3 shows a field device F" of the invention in greater detail. It includes the same external components as the field devices F, F' illustrated in FIGS. 1 and 2. The essential difference is, however, that the processing unit CPU is embodied as a dynamically reconfigurable, logic chip LC. Configured on the logic chip LC are a microcontroller μC and a function module M, as well as a watchdog timer K, two interfaces JTAG and UART as well as a controller for a memory FLASH.

Figure 3A:
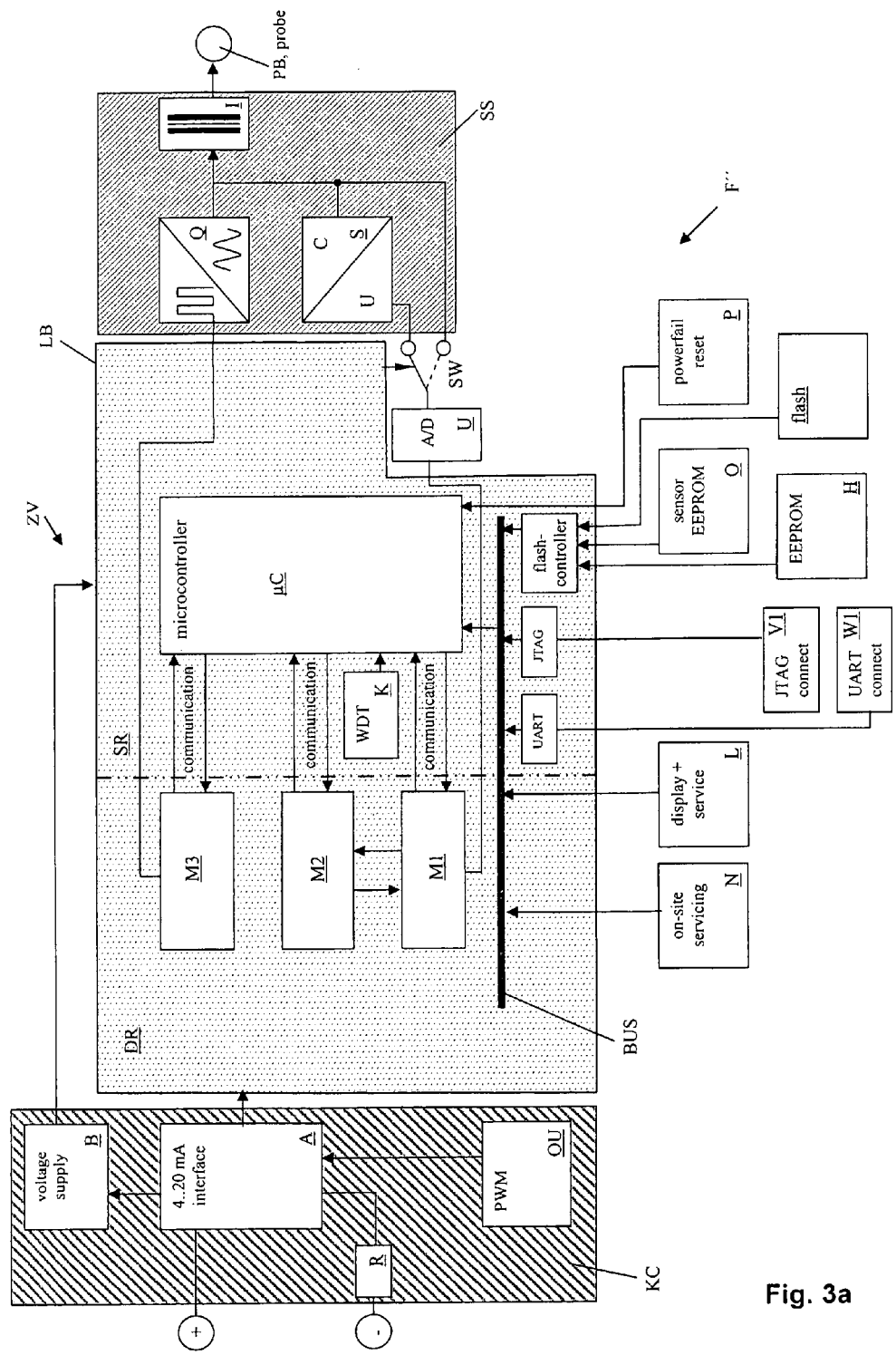
FIG. 3*a* is a schematic drawing of a field device of FIG. 3 in a first operational phase.
Figure 3B:
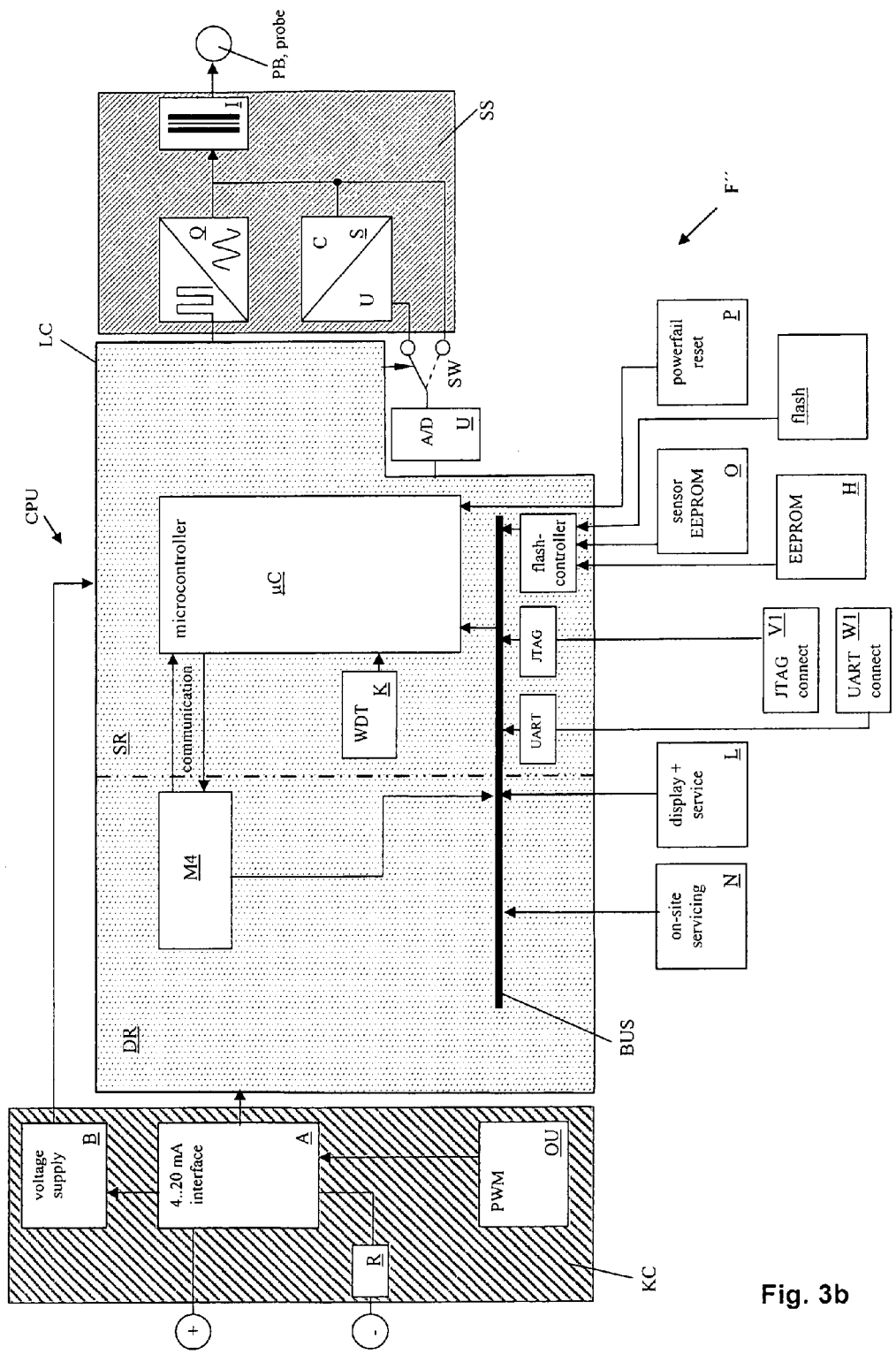
FIG. 3*b* is a field device of FIG. 3 in a second operational phase.
Figure 3C:
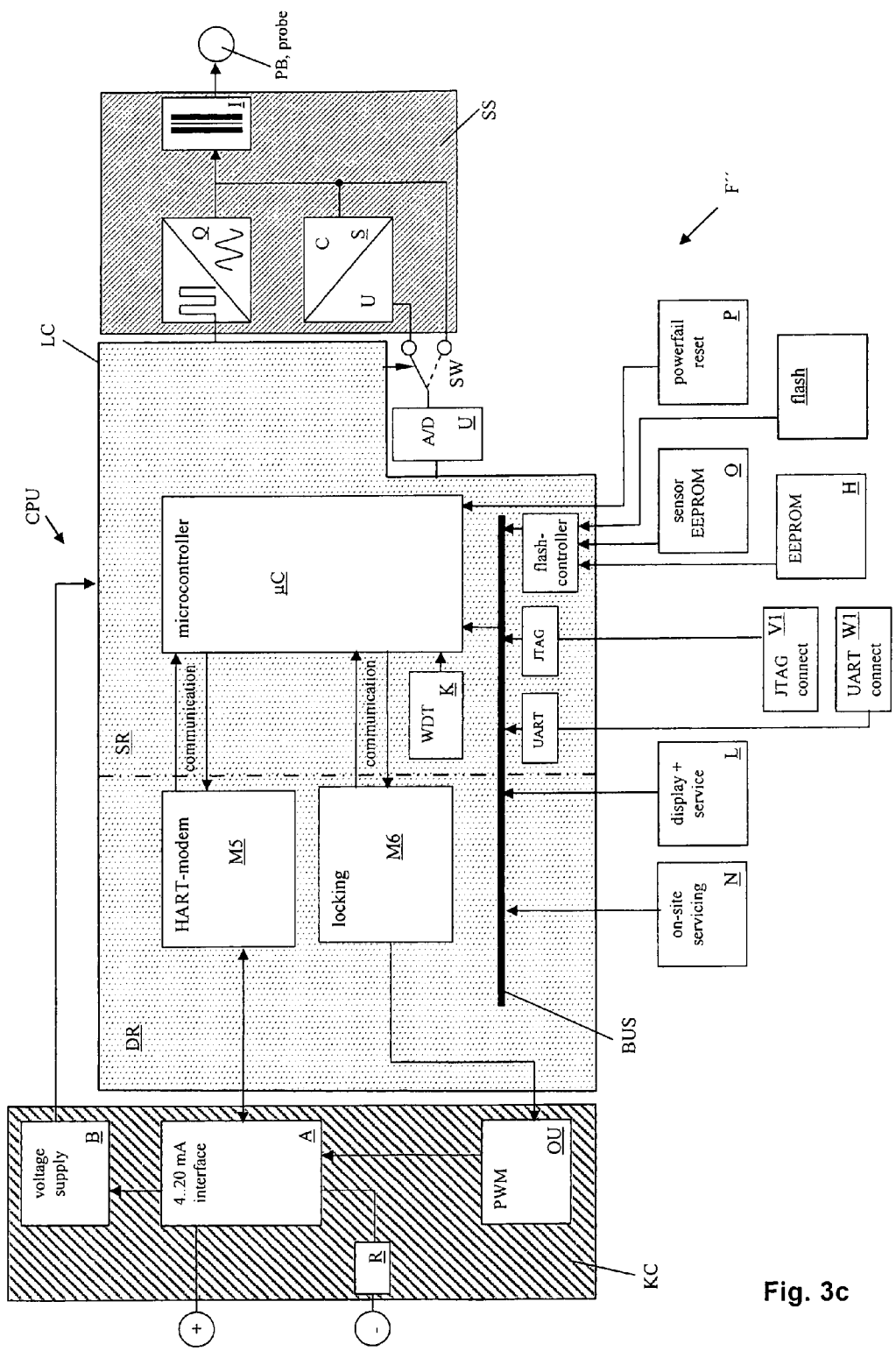
FIG. 3*c* is a field device of FIG. 3 in a third operational phase.

FIGS. 3a-3c show the field device F" of FIG. 3 of the invention during different operating phases in greater detail. In all three figures, to avoid cluttering the drawing, only the components of the field device F" actually required during the operational phase of concern are shown.

The logic chip LC is divided into two regions, a dynamic region DR and a static region SR. In the static region, a microcontroller μC is permanently configured, which communicates via a peripheral bus with the UART interface, the JTAG interface and the controller for the memory FLASH.

In the dynamic region DR, one or more function modules are configured. The communication of these modules with the microcontroller μC occurs via hardware FIFO channels (Fast Simplex Links).

The individual function modules can be dynamically configured via corresponding configuration bit streams, separately and during runtime. Normally, the configuration bit streams are stored in the external memory FLASH. The loading process is initiated by a corresponding control program in the microcontroller μC.

The field device of FIG. 3a is shown during a first phase, the actual measuring phase. Therefore, only function modules necessary for evaluating the measurement signal are configured. These are an amplitude and phase calculation module M1, a capacitance calculation module M2 and a phase shift module M3. Active as external hardware components during this operational phase are the low-pass filter Q, the isolating unit I, the probe PB, the converter unit U, the switch SW and the electrical current to voltage converter S.

All additional external hardware components are currently not actively involved. They require, thus, either no energy at all or only minimal energy.

Since, especially, the function modules M1 and M2 are designed for parallel data processing, the measurement signal evaluation can occur correspondingly rapidly.

FIG. 3b shows the field device during an additional, second phase, in which the user can service the device. For this, a display/service module M4 is configured as a function module, which activates the display/service unit L.

The user has available, at this point in time, the complete display/service functionality of the field device.

This function module M4 can be configured e.g. in the freed resources of the currently not required function module M2 for the amplitude and phase calculation.

During this second phase, no measurement signal evaluation takes place. There is, therefore, momentarily no energy consumed for this functionality.

An option is also to not completely remove the measurement signal evaluation, but, instead only to remove part of it, when the display/service module M4 is loaded.

FIG. 3c shows the field device F during a third phase. In this phase, communication with an external unit takes place. For this, all function modules necessary for communication are configured. These are, here, the function module, HART modem M5, and the locking module M6.

The operation of the field device of the invention will now be explained again. The currently required function modules are dynamically configured on the logic chip LC on request of the control program running in the microcontroller μC. The configuring of the function modules M1-M6 occurs in simple manner via a configuration bit stream loaded out of the memory FLASH.

Proven as very advantageous is to provide on the dynamically reconfigurable logic chip LC two regions, a dynamic region and a static region. The static region SR is permanently configured as a control unit (microcontroller μC), in which the control program runs. The dynamic region DR is provided for the individual function modules. Individual function modules can be configured successively in the same region, so that the dynamic region, in spite of high functionality, can be embodied compactly.

The function modules M1-M6 provide different functionalities such as evaluating the measurement signal, generating an output value for the communication circuit, signal filtering for the measurement signal, and operating the display/service unit.

A field device having a dynamically reconfigurable logic chip offers the advantage that only currently required function modules must be configured.

This permits the application of relatively small logic chips with little memory capacity. Such small logic chips require correspondingly little energy.

All additional functionalities are, in principle, available, since they are stored as function modules in the memory FLASH and can be configured at any time, to the extent that corresponding resources are free.

The field device of the invention requires relatively little energy and permits, in spite of this, a high measure of functionality. Moreover, it permits very fast data processing, because, for currently required functionalities, all resources of the dynamic region DR are available and, therewith, parallel processing is an option.

Due to the small energy consumption, the field device F'" can, e.g. via a fieldbus, or a process control loop, be supplied with energy (loop powered), without a separate energy supply line being necessary.

Incremental Adding of Function Modules

Field devices with dynamically reconfigurable logic chips offer still other advantages. Thus, e.g. in the case of a system start (startup) either all function modules can be equally loaded from the beginning or the function modules are loaded delayed in time, corresponding to their priority. In the case of the first alternative, all functions of the field device are available directly after system start.

Figure 4:
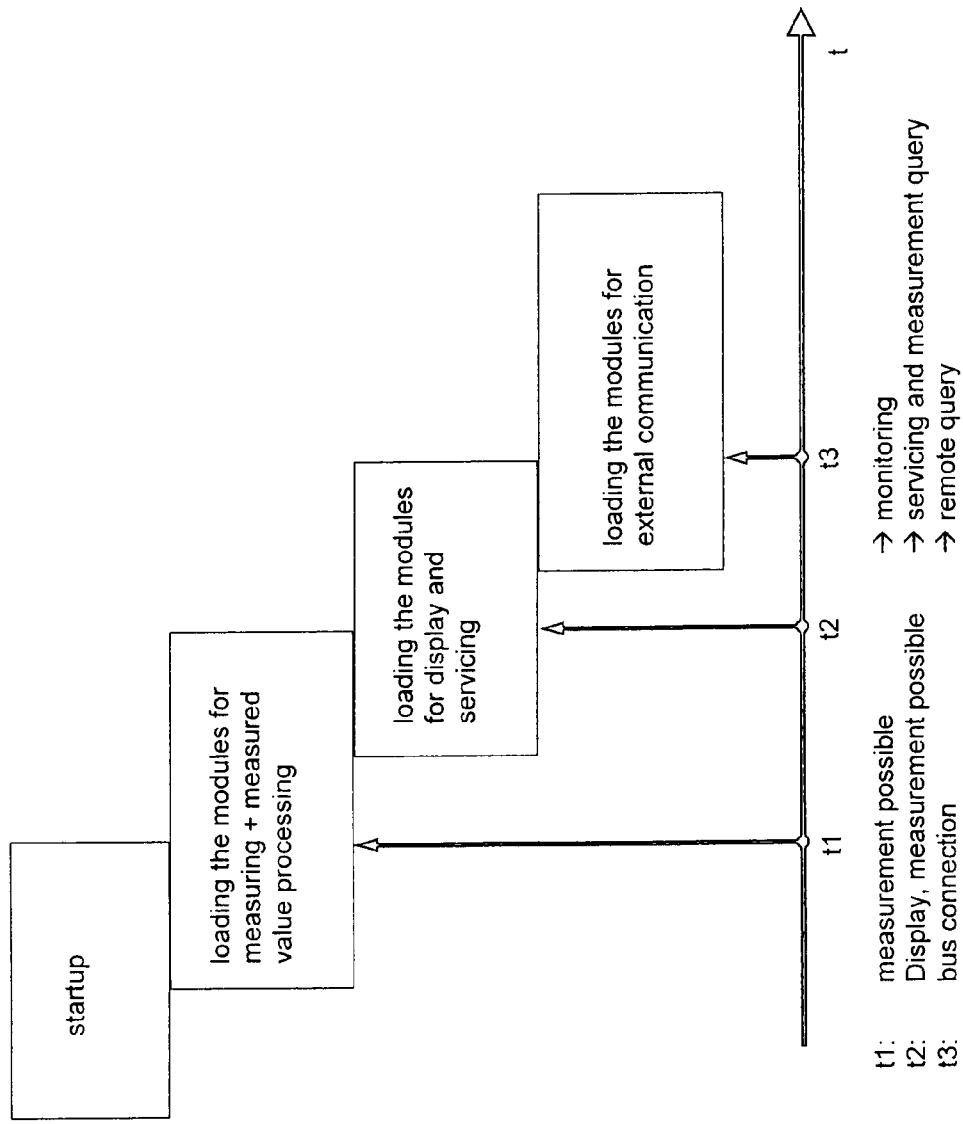
FIG. 4 shows the loading of modules of different priority as a function of time during the system start phase.

The second alternative offers, however, the advantage, that the measured value is rapidly available. For this, after system start, only the function modules necessary for evaluating the measurement signal (e.g. M1, M2, M3), which, therefore, have a high priority, are loaded. Then, the display/service module M4, which has a medium priority, is loaded, and, lastly, the modules having a low priority, such as e.g. the modules required for communication (e.g. M5, M6), are loaded. This time delay for loading the function modules is shown in FIG. 4. When the field device shortly after the point in time t1 is turned back off, the energy required for loading the following function modules is saved. A further energy savings potential lies in, for system start, making more resources available by tailoring the structure of the function modules for a fast system start. Thus, e.g. the area made available to the display/service module at the beginning is kept relatively small. At a later point in time, the area can then be enlarged. The area taken up by a function module on the logic chip, i.e. the number of logic circuits used, is directly correlated with the functionality of the module of concern. Small area means less functionality, or less performance, which results e.g. in a slower processing speed.

Reconfigurable logic chips offer even the advantage of loading the microcontroller with a completely initialized register. In this way, the normally necessary, initializing phase is absent, which, likewise, has an energy savings effect.

Adaptive Hardware

Figure 5:
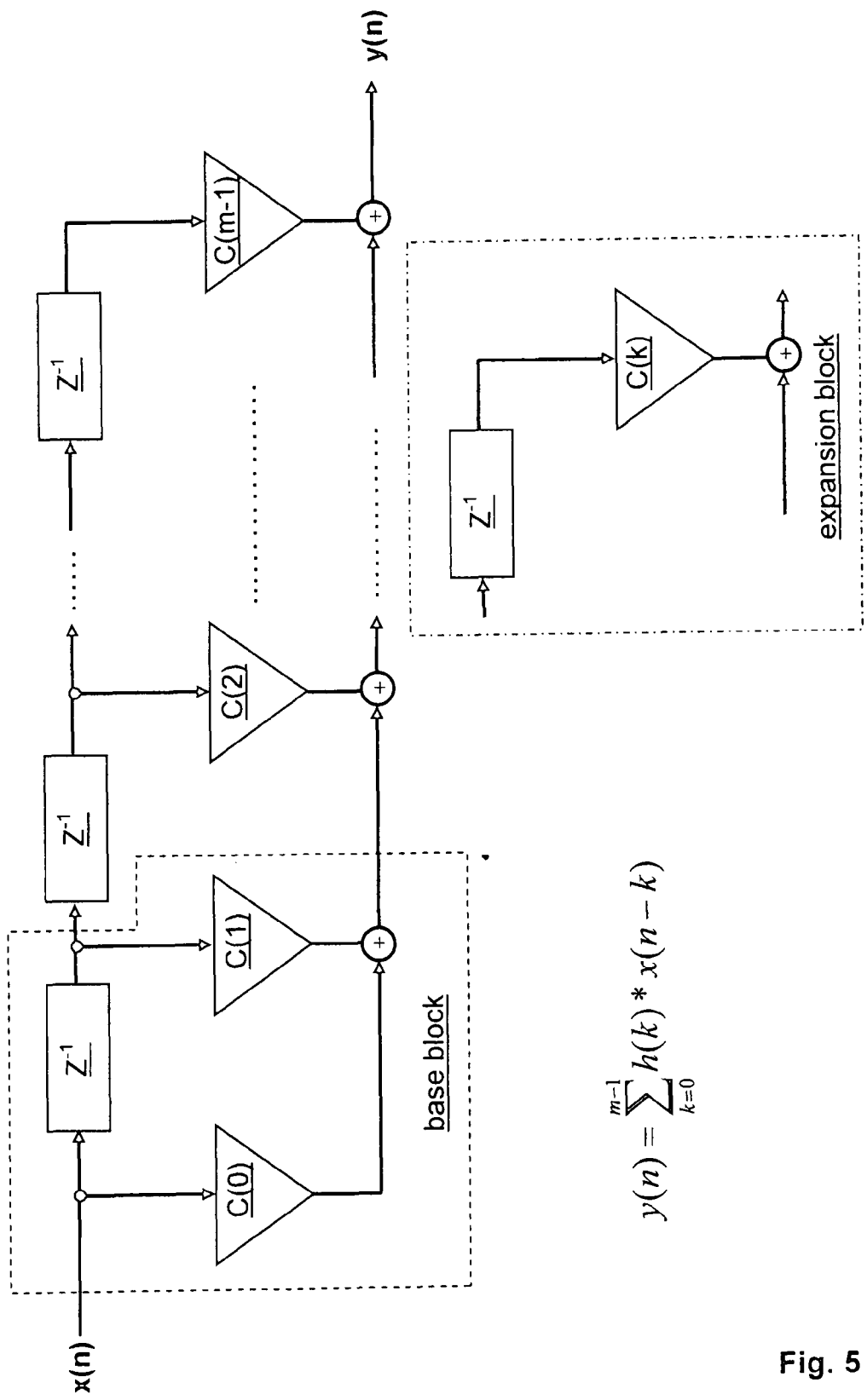
FIG. 5 shows a hardware filter having a plurality of blocks.

A further advantage, which dynamically reconfigurable logic chips offer, is the opportunity for dynamically adapting hardware components. An example is a digital filter, which represents a differential equation with n summands (FIG. 5). The filter can be constructed of a base block and a plurality of identical, expansion blocks. More expansion blocks mean an improved filter function connected with a correspondingly greater energy consumption. As a function of desired requirements as regards energy consumption, performance, and available area, more or less expansion blocks are configured on the dynamically reconfigurable logic chip.

The filter on the dynamically reconfigurable logic chip is, thus, adapted to the requirements of the moment.

The adaptation can depend on different criteria, e.g. signal/noise separation, available energy, cyclic repetitions, processing speed, etc.

A further example of sensibly using adaptive hardware is echo tracking in the case of radar fill level measuring devices. Here, the wanted echo signal of the echo signal is ascertained. Besides the wanted echo signal, the echo signal includes, most often, also disturbing echoes and a noise level. The later the wanted echo signal occurs in the echo signal (the greater, thus, the distance to be measured), the smaller is the amplitude of the wanted echo signal. For safe identification of the wanted echo signal, such is tracked over a number of measurements. The echo curves can, in such case, be presented in a 3-dimensional space as an echo field, in which the time shifting of the wanted echo can be tracked.

In the case of a filtering over the echo field, it can make sense, to adapt the filter cyclically, e.g. after each 100 measurements.

A further example for the use of adaptive hardware is offered by capacitive fill level measuring technology. In part, field devices are applied here, which work with different frequencies. For accretion detection, or for DK calculation, sporadically, a high frequency is switched in. Here, correspondingly, the frequency of the sampling rate, or the number of expansion blocks, can be adapted.

Also in the case of a Fourier transformation, an adaptive hardware is likewise advantageous. The Fourier transformation can be implemented as a filter, likewise via a base block and a number of expansion blocks, in hardware on the dynamically reconfigurable logic chip.

If new frequency peaks appear in a Fourier spectrum, then an adapting of the transformative behavior can occur through additional expansion.

Dynamic Test Functions as Test Modules

An additional advantage offered by field devices with dynamically reconfigurable logic chips is with regard to the testing of functions of a field device.

Figure 6:
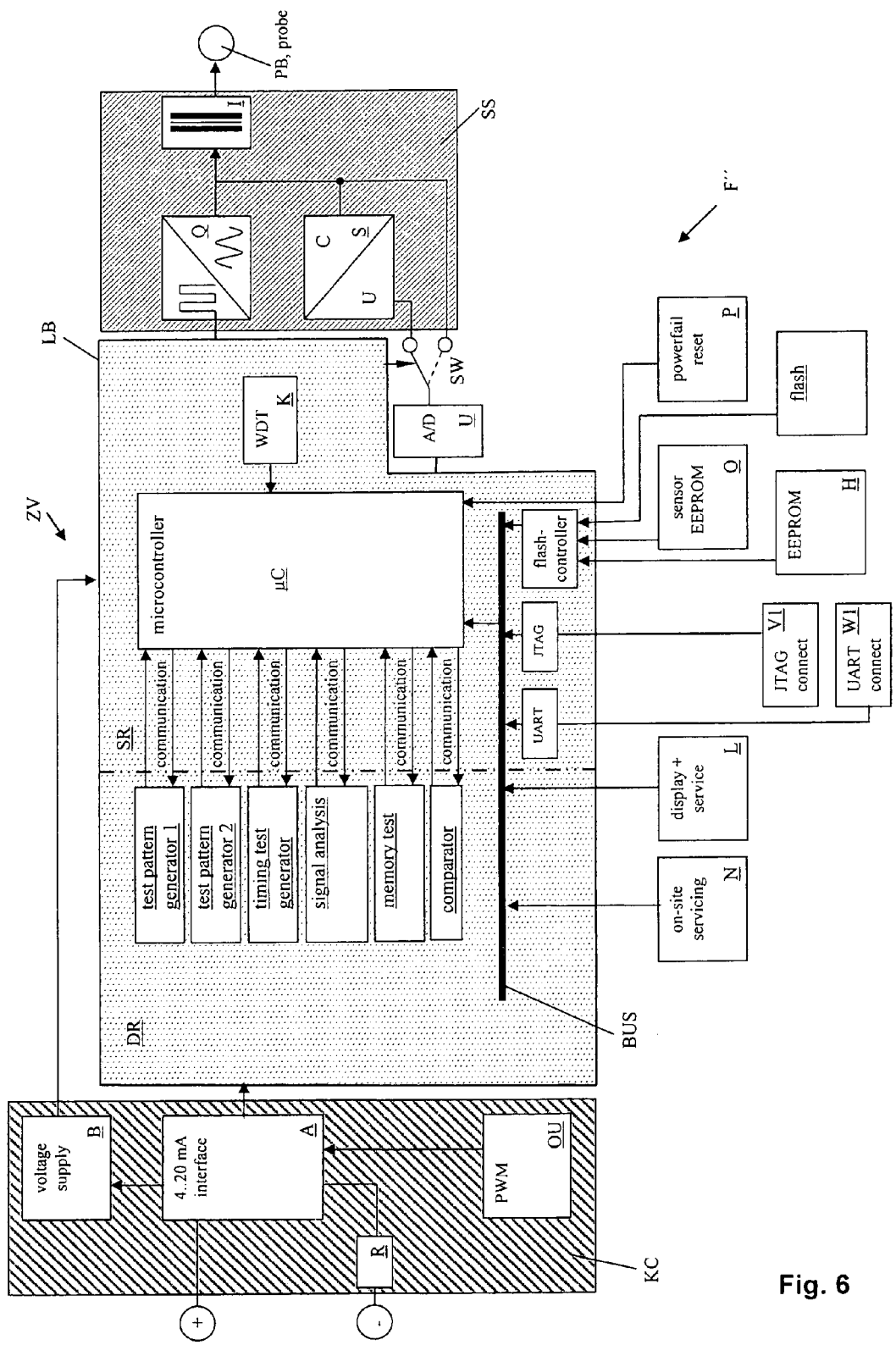
FIG. 6 shows a configurable field device having a plurality of test modules.

For this, test modules are loaded as function modules on the dynamically reconfigurable logic chip. Examples of possible test modules are memory test modules, signal analysis modules, comparator modules, timing test generator modules and test pattern generator modules, which are loaded into the dynamic region DR of the logic chip LC (FIG. 6).

The test modules can be applied e.g. only during the production phase of the field device, for testing certain functionalities of the field device.

Alternatively, test modules can be called up cyclically, sporadically or on requirement, for testing during operation of the field device In advantageous manner, a test template is provided for tests in the production phase. The test template provides different, suitably predefined regions (slots) for test modules.

The slots have already defined interfaces for the microcontroller μC on and possess a predefined variable. The different test modules are then loaded into the slots.

Loaded into a slot for memory test modules can be different modules, depending on connected memory module. As examples for corresponding algorithms are named walking pattern, marching pattern, descrambled, not descrambled, etc.

A simplifying of test modules is possible, when, with the assistance of the microcontroller μC and a feedback shift register in the in/output region, I/O region, the results of the tests are evaluated via a signature analysis.

Through the large computing power of the processing unit CPU, among others through the parallel data processing (parallel processing), extensive and complicated signal analyses are possible in very short time. To the response signal of a test signal can e.g. a Fourier transformation can be applied, in order to analyze the signal equally in the frequency range.

Fundamentally, it is possible to generate test modules for most conceivable test cases. Typically, for field device classes, or field device families, of a field device manufacturer, recurring test requirements can be defined, which can be covered by test templates.

Besides tests during the production phase, also tests during operation of the field device are of decisive importance as regards safety of the total application in which the field device is applied. If, currently, too little area is available for a test module, then the area of other function modules can be lessened for a short time, in order to provide area for the required test module. Reloading of test modules can, such as already above mentioned, occur cyclically, sporadically or on requirement. Following termination of a test, the test modules are again removed.

Test modules are of large importance for self-learning systems, in the case of which parameters are monitored and logged with the assistance of test modules. Therewith, predictions can be made concerning availability.

Test modules can also be altered simply, e.g. parameter dependently, lifetime dependently, available power dependently, temperature dependently, etc.

If, via a test with the assistance of a test module, it is detected, that individual locations of the dynamically reconfigurable logic chip are malfunctioning, these can be again overwritten or the regions of these defective locations can, from then on, be avoided. This is especially advantageous in the case of applications with high radiation load, where cell defects can easily arise through radiation influences ("upsetting of the cells").

In this way, availability of the field device is drastically increased.

An additional advantage, which test modules enable, is self-calibration of the field device. Corresponding test modules for self-calibration can be applied for testing subfunctions of the field device, in order, so, to draw conclusions concerning the "state" of these subfunctions.

LIST OF REFERENCE CHARACTERS

TABLE 1

| | |
|---|---|
| 4-20 mA interface | A |
| amplitude and phase calculation module | M1 |
| capacitance calculation module | M2 |
| communication cirucit | KC |
| connectors JTAG | V1, V2 |
| connectors UART | W1, W2 |
| converter unit | U |
| current to voltage converter | S |
| data memory | H |
| data memory | O |
| data region | DR |
| display/service module | M4 |
| display/service unit | L |
| field device | F, F', F" |
| HART modem module | M5 |
| isolating unit | I |
| JTAG interface | JTAG |
| locking unit | LU |
| logic chip | LC |
| low pass filter | Q |
| memory | FLASH |
| microcontroller | μC1 |
| microcontroller | μC2 |
| model | C |
| onsite servicing | N |
| operating unit | OU |
| phase shifting module | M3 |
| phase shifting unit | T |
| power reset circuit | P |
| power reset circuit | J |
| probe | PB |
| processing unit | CPU |
| static region | SR |
| switch | SW |
| UART interface | UART |
| voltage supply circuit | B |
| watchdog timer | K |
| watchdog timer | D |

The invention claimed is:

1. A configurable field device for process automation technology for determining a process variable, comprising:
a probe;
a control unit;
an analog sensor circuit, which is connectable with said probe for registering the process variable and which outputs an analog measurement signal dependent on a registered process variable;
a converter unit connected after said sensor circuit for changing the analog measurement signal into a digital measurement signal;
a processing unit connected with said converter unit, in which function modules are provided, which serve for evaluating said digital measurement signal, for generating an output value for the process variable and for control of the field device; and
an analog communication circuit connected with said processing unit which serves for forwarding the output value to an external unit, wherein:
said processing unit comprises a partially dynamically reconfigurable logic chip, in which function modules are configured on request of a control program running in said control unit;

configuration of said function modules occurs by means of a configuration bit stream, which is loaded into said reconfigurable logic chip; and said processing unit has a dynamic region and a static region, wherein, in the static region, said control unit, which is preferably a microcontroller, is permanently configured.

2. The configurable field device as claimed in claim 1, wherein:
at least one function module serves for evaluating said digital measurement signal.

3. The configurable field device as claimed in claim 1, wherein:
at least one function module serves for generating the output value for the communication circuit.

4. The configurable field device as claimed in claim 3, wherein:
the function module for generating the output values for the communication circuit is a fieldbus controller, or a HART modem.

5. The configurable field device as claimed in claim 3, wherein:
the function module for evaluating said digital measurement signal is a signal filter.

6. The configurable field device as claimed in claim 1, wherein:
a function module serves for operating a display/service unit.

7. The configurable field device as claimed in claim 1, wherein:
said logic chip, has a plurality of logic cells, which are connected together via electronic switches, that;
in a static region of said logic chip, function modules are fixedly configured;
the logic cells of these function modules are connected together via permanent connections, and, in a dynamic region, function modules are configured at times, wherein the logic cells of these function modules are connected together at times via electronic switches.

8. A method for operating a configurable field device of process automation technology, comprising the steps of:
executing a control program in a microcontroller of a processing unit;
requesting a function module by the control program; and
configuring the function module on a dynamically reconfigurable logic chip during runtime, wherein:
during a system start phase, steps are performed as follows:
configuring at least one function module of high priority at a point in time t1;
executing this function module;
configuring at least one function module of medium priority at a point in time t2;
executing this function module;
configuring at least one function module of low priority at a point t3; and
executing this function module.

9. The method as claimed in claim 8, wherein:
the number of logic circuits of at least one function module is different during the system start phase and the operational phase.

10. The method as claimed in claim 9, wherein:
at the beginning of the system start phase, a microprocessor with initialized registers is configured.

11. The method as claimed in claim 10, wherein:
a test module is configured only during the production phase of the field device.

12. The method as claimed in claim 10, wherein:
a test module is configured cyclically or sporadically on request of the control program.

13. The method as claimed in claim 8, wherein:
function modules of high priority have available during the system start phase a larger number of logic circuits.

14. The method as claimed in claim 8, wherein:
a test module is configured, which serves for testing function modules and/or software functionalities of the field device.

15. The method as claimed in claim 8, wherein:
the area occupied by a function module on the reconfigurable logic chip is expanded or lessened.

16. The method as claimed in claim 8, wherein:
the function module is a digital filter or a function module for FFT calculation, which is composed of a base block and a plurality of expansion blocks.

* * * * *